(12) United States Patent
Paul et al.

(10) Patent No.: US 11,899,088 B2
(45) Date of Patent: Feb. 13, 2024

(54) MAGNETIC RESONANCE IMAGING OF AN OBJECT WITH A FIRST AND A SECOND MATERIAL

(71) Applicant: Siemens Healthcare GmbH, Erlangen (DE)

(72) Inventors: Dominik Paul, Bubenreuth (DE); Mario Zeller, Erlangen (DE); Kun Zhou, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 41 days.

(21) Appl. No.: 17/848,561

(22) Filed: Jun. 24, 2022

(65) Prior Publication Data

US 2023/0003819 A1    Jan. 5, 2023

(30) Foreign Application Priority Data

Jul. 2, 2021 (CN) .......................... 202110752976.4

(51) Int. Cl.
*G01R 33/56* (2006.01)
*G01R 33/561* (2006.01)

(52) U.S. Cl.
CPC ..... *G01R 33/5608* (2013.01); *G01R 33/5617* (2013.01)

(58) Field of Classification Search
CPC .......................... G01R 33/5608; G01R 33/5617
See application file for complete search history.

(56) References Cited

U.S. PATENT DOCUMENTS

| | | | |
|---|---|---|---|
| 8,624,595 B2 * | 1/2014 | Umeda | G01R 33/56554 324/309 |
| 10,362,961 B2 * | 7/2019 | Koktzoglou | A61B 5/02007 |
| 11,137,466 B2 * | 10/2021 | Nielsen | G01R 33/5613 |

* cited by examiner

*Primary Examiner* — Gregory H Curran
(74) *Attorney, Agent, or Firm* — Banner & Witcoff Ltd.

(57) ABSTRACT

Techniques are disclosed for use in magnetic resonance imaging (MRI) for exciting spins of a first material and spins of a second material. A first spin echo signal is acquired when the excited spins include a first phase difference, which is given by $\Delta$, and a second spin echo signal is acquired when the excited spins of the first material and the excited spins of the second material include a second phase difference, which is given by $-\Delta$. An absolute value of $\Delta$ lies within the interval $]0,\pi[$. A first image for the first material and/or a second image for the second material is generated by a computing unit depending on the first spin echo signal and the second spin echo signal.

15 Claims, 4 Drawing Sheets

FIG 6

MAGNETIC RESONANCE IMAGING OF AN OBJECT WITH A FIRST AND A SECOND MATERIAL

CROSS-REFERENCE TO RELATED APPLICATIONS

The present application claims the benefit of the filing date of China patent application no. CN 202110752976.4, filed on Jul. 2, 2021, the contents of which are incorporated herein by reference in their entirety.

TECHNICAL FIELD

The disclosure is directed to a method for magnetic resonance imaging of an object, wherein spins of a first material of the object and spins of a second material of the object are excited, a first spin echo signal is acquired when the excited spins of the first material and the excited spins of the second material include a first phase difference, which is given by Δ, a second spin echo signal is acquired and a first image for the first material and/or a second image for the second material is generated by a computing unit depending on the first spin echo signal and the second spin echo signal. The disclosure is further directed to a corresponding magnetic resonance imaging system and a computer program product.

BACKGROUND

Different materials or molecules, in particular water molecules and fat molecules, have slightly different nuclear spin resonance frequencies. Therefore, when performing a magnetic resonance imaging (MRI) acquisition, their spins go in-phase and out-of-phase with each other over time.

The time points of different material spins being in-phase or having opposed phases depend on the field strength of the MRI main magnetic field. The interval between an in-phase and an out-of-phase condition decreases linearly with increasing field strength B: $\Delta t = 1/(2 \ast B \ast \gamma \ast 3.4 \ast 10\text{-}6)$, wherein γ denotes the gyromagnetic ratio.

A post-processing algorithm can then separate fat and water-related signals to create two images displaying fat and water fractions only, respectively. This technique is known as Dixon imaging.

Depending on the details of the used acquisition sequence, a rewinding gradient may be applied to compensate for the momentum asymmetry resulting from the in-phase and out-of-phase readouts. This may be done for example when using spin echo or turbo spin echo acquisition sequences. However, such rewinding has the drawback of an increased acquisition time.

Furthermore, the potentially asymmetric gradient activity may lead to an increased occurrence of eddy currents and/or gradient nonlinearity effects and corresponding artifacts in the reconstructed image.

SUMMARY

It is therefore an objective of the present disclosure to reduce the acquisition time and/or effects leading to artifacts in material specific spin echo based MRI. This objective is achieved by the subject matter of embodiments as discussed herein, including the claims.

The disclosure is based on the idea to acquire two spin echo signals at respective times, where the spins of the first material and the spins of the second material include a phase difference Δ and -Δ, respectively, wherein Δ is different from 0 and different from π. These signals are used instead of in-phase and opposed-phase signals to separate the different material influences. In this way, a more symmetric gradient activity may be achieved and/or less acquisition time is required.

According to an aspect of the disclosure, a method for MRI of an object is provided. Therein, spins of a first material of the object and spins of a second material of the object are excited, e.g. by applying one or more excitation RF pulses to the object. A first spin echo signal is acquired when the excited spins of the first material and the excited spins of the second material include a first phase difference, which is given by Δ. A second spin echo signal is acquired when the excited spins of the first material and the excited spins of the second material include a second phase difference, which is given by -Δ. An absolute value of Δ is greater than zero and smaller than π, in other words, it lies within the interval ]0,π[. A first image for the first material, e.g. a first MRI image, for example a first spatial MRI image, and/or a second image for the second material, e.g. a second MRI image, for example a second spatial MRI image, is generated by a computing unit depending on the first spin echo signal and the second spin echo signal.

The method may be based on a spin echo acquisition technique or a turbo spin echo acquisition technique.

The spins of the first and the second material can be understood as respective nuclear spins within a spatial region subject to the excitation RF pulse.

RF pulses denote pulses of electromagnetic waves in the radio frequency (RF) range. RF pulses may therefore have frequencies, e.g. in the range from 20 kHz to 300 GHz. In the MRI context, RF frequencies in the range from 100 kHz to 1 GHz, e.g. from 1 MHz to 1 GHz, are commonly used.

The one or more excitation RF pulses correspond e.g. to 90° pulses generated by one or more respective excitation coils to flip the spins by 90° from the direction of a static main magnetic field.

As an example, the first and the second spin echo signal are acquired during a single spin echo or turbo spin echo acquisition period. In other words, an echo time of the first spin echo signal differs from an echo time of the second spin echo signal. The echo time may for example be defined with respect to a corresponding refocusing RF pulse or 180°-RF pulse, which is applied after the one or more excitation RF pulse are applied and before the first and the second spin echo signals are acquired. For instance, the first spin echo signal may be acquired prior to the acquisition of the second spin echo signal. In other words, the echo time of the first spin echo signal may be smaller than the echo time of the second spin echo signal.

The phase difference Δ is defined such that it is positive and smaller than π. However, an analogous further phase difference Δ' may be considered as well, which would then be negative and greater than -π. In this case, the first spin echo signal corresponds to a situation where the spins of the different materials include a further first phase difference given by Δ', and the second spin echo signal corresponds to a situation where the spins of the different materials include a further second phase difference given by -Δ'. However, this is merely a matter of definition and does not alter the inventive concept.

As a consequence of excluding the boundary values of zero and π for the value of Δ, the excited spins of the first and the second material are neither exactly in-phase nor exactly in an opposed phase condition when acquiring the first and the second spin echo signal.

The spins of the first and second material being in-phase can be understood as the respective spins including a phase angle of 0. The spins being out-of-phase can be understood as the spins having opposite phases or including a phase angle of $\pi$.

In some implementations, the absolute value of $\Delta$ lies within an even smaller range, for example with the interval $[\pi/6, 5\pi/6]$, within the interval $[\pi/4, 3\pi/4]$, etc.

The first and the second spin echo signals are acquired by applying respective read-out gradients, i.e. magnetic field gradients, and, for example, respective slice selection gradients and, e.g. respective phase gradients in respective directions and by reading out the signals of respective acquisition coils.

In general, magnetic field gradients can be applied in three spatial directions by means of corresponding gradient coils. Here and in the following, an axis perpendicular to the plane of the desired tomography slices is denoted as slice selection direction or, without restriction of generality, as the z-direction. A corresponding magnetic field gradient in this direction is denoted as a slice selection gradient or Gz. The slice selection gradient is, e.g., applied during the excitation of the spins by the excitation RF pulses.

A direction perpendicular to the slice selection direction, without restriction of generality the y-direction, is denoted as phase encoding direction and the respective gradient is denoted as a phase gradient or Gy. The phase gradient defines a dephasing for each respective k-space line, for example in the y-direction.

The direction perpendicular to the slice selection direction and to the phase selection direction is denoted as the read-out direction, without restriction of generality as x-direction. A magnetic gradient in the read-out direction is denoted as a read-out gradient or Gx.

As an example, the first material may correspond to or comprise fat molecules while the second material may correspond to or comprise water molecules.

By applying the one or more excitation RF pulses, spins of both materials are excited.

However, since protons of different materials, for example of water and fat molecules, may have slightly different resonance frequencies with respect to the nuclear spin position, their spins go in-phase and out-of-phase with each other as a function of time.

Acquiring the spin echo signals comprises e.g. recording the respective signal intensities in k-space, also denoted as momentum space, or over time, respectively, by means of respective read-out coils.

The method according to the disclosure has the advantage that the echo times of the first and the second spin echo signals are symmetrically shifted with respect to an in-phase time instance, which corresponds to a situation where the spins of the first and the second material are in-phase or, in other words, include a phase difference of zero. Consequently, the gradient activity during the acquisition is more symmetric as in known methods, which reduces eddy currents and effects due to gradient nonlinearity. Rewinding gradients for compensating the momentum asymmetry may be omitted, which leads to a reduced acquisition time.

According to several implementations of the method, a first read-out gradient lobe, which is centered at a first read-out center time, is applied to acquire the first spin echo signal and a second read-out gradient lobe, which is centered at a second read-out center time, is applied to acquire the second spin echo signal. The first read-out center time precedes the in-phase time, wherein the excited spins of the first material and the excited spins of the second material are in phase at the in-phase time. The second read-out center time succeeds the in-phase time.

Therein, the time difference between the latest refocusing RF pulse and the first read-out center time corresponds to the first echo time of the first spin echo signal. The time difference between the latest refocusing RF pulse and the second read-out center time corresponds to the second echo time of the second spin echo signal.

As an example, the time difference between the in-phase time and the first read-out center time is equal to the time difference between the second read-out center time and the in-phase time and defines the absolute value of $\Delta$.

Here and in the following, applying a gradient lobe can be considered to comprise switching on a magnetic field gradient over a respective time period without a change in polarity of the gradient.

As an example, the first read-out gradient lobe and the second read-out gradient lobe are applied in read-out direction.

According to several implementations, the first read-out gradient lobe and the second read-out gradient lobe have opposite polarities.

According to several implementations, a refocusing RF pulse is applied before acquiring the first spin echo signal and second spin echo signal and, e.g., after applying the at least one excitation RF pulse.

In other words, the refocusing RF pulse is applied before the first read-out gradient lobe and before the first read-out gradient lobe are applied.

For example, there may be no further excitation RF pulse nor is there a further refocusing RF pulse being applied between the first read-out gradient lobe and the second read-out gradient lobe. Such a sequence may be considered as a fast Dixon acquisition scheme. For instance, the echo signals are centered around zero transitions of the momentum in read-out direction.

According to several implementations, a pre-phasing gradient lobe is applied, e.g. after the at least one excitation RF pulse.

The pre-phasing gradient lobe may, e.g., be applied in read-out-direction. It may be used to adjust the sampling position in k-space by causing a respective momentum change. A momentum change due to a gradient lobe is proportional to a time integral over the respective magnetic field gradient during the time period of the lobe. Therefore, the amplitude and the duration of the respective gradient lobes uniquely define the respective momentum changes.

According to several implementations, the pre-phasing gradient lobe is applied prior to the refocusing RF pulse. The pre-phasing gradient lobe and the read-out gradient lobe may have the same polarity.

According to several implementations, the pre-phasing gradient lobe is applied after the refocusing RF pulse and before acquiring the first spin echo signal and before acquiring the second spin echo signal. The pre-phasing gradient lobe and the read-out gradient lobe may have different polarities.

In this way, the time between the pre-phasing gradient lobe and the first and the second spin echo signals is reduced. Consequently, artifacts due to dynamic effects in the object, such as pulsating cerebrospinal fluid, may be reduced.

According to several implementations, a third spin echo signal is acquired when the excited spins of the first material and the excited spins of the second material include the second phase difference. A fourth spin echo signal is acquired when the excited spins of the first material and the excited spins of the second material include the first phase difference, e.g. after acquiring the third spin echo signal. The first image and/or the second image is generated by the computing unit depending on the first spin echo signal, the second spin echo signal, the third spin echo signal, and the fourth spin echo signal.

As one example, a further refocusing RF pulse is applied after acquiring the first and the second spin echo signal and prior to acquiring the third and the fourth spin echo signal. For example, in case the pre-phasing gradient lobe is applied after the refocusing RF pulse, a time delay corresponding to a duration of the pre-phasing gradient lobe may be present between applying the further refocusing RF pulse and before acquiring the third and the fourth spin echo signal. In this case, it may be ensured that the echo times of the first and the third spin echo signal are equal and the echo times of the second and the third spin echo signals are equal.

By taking into account the first, the second, the third, and the fourth spin echo signals for image reconstruction, an improved image quality may be achieved. For instance, the individual spin echo signals may be combined, averaged, weighted, etc. for the image reconstruction. Also phase corrections, for example similar as in turbo gradient spin echo, TGSE, acquisitions, may be implemented in the image reconstruction.

Apart from the first, the second, the third, and the fourth spin echo signals, further echo sequences may be carried out and processed to obtain the first and/or the second image.

According to several implementations, a third read-out gradient lobe, which is centered at a third read-out center time, is applied to acquire the third spin echo signal. A fourth read-out gradient lobe, which is centered at a fourth read-out center time, is applied to acquire the fourth spin echo signal. The third read-out center time precedes a further in-phase time, wherein the excited spins of the first material and the excited spins of the second material are in phase at the further in-phase time. The fourth read-out center time succeeds the further in-phase time.

Therein, the time difference between the further refocusing RF pulse and the third read-out center time corresponds to the third echo time of the third spin echo signal. The time difference between the further refocusing RF pulse and the fourth read-out center time corresponds to the fourth echo time of the fourth spin echo signal.

For instance, the time difference between the further in-phase time and the third read-out center time is equal to the time difference between the fourth read-out center time and the further in-phase time.

For example, the third read-out gradient lobe and the fourth read-out gradient lobe are applied in read-out direction and/or have opposite polarities. For instance, the first read-out gradient lobe and the third read-out gradient lobe have opposite polarities. As one example, the second read-out gradient lobe and the fourth read-out gradient lobe have opposite polarities. In other words, the first and the fourth read-out gradient lobes have the same polarity and the second and the third read-out gradient lobes have the same polarity.

The spin echo signals with the same echo time, also denoted as dephasing time, namely the first and the third spin echo signal as well as the second and the fourth spin echo signal, may therefore be acquired with opposite read-out polarities. The resulting phase differences may be addressed for reconstructing the first and/or second image.

To this end, spin echo signals with the same echo time but different readout polarity may be considered within a common k-space and to a same k-space and respective phase corrections, for example TGSE-like phase corrections, may be performed before the separation of contributions from the different materials. A reference scan without phase encoding may be performed upfront. Such implementations allow for an improved flexibility for reordering.

In other implementations, only spin echo signals with the same echo time and the same readout polarity may be considered in a common k-space. In other words, one k-space is sampled for each readout polarity. After a 2D phase correction of these k-spaces, complex averaging may be applied to obtain a single k-space. Afterwards, the separation of contributions from the different materials may be performed.

According to a further aspect of the disclosure, an MRI system is provided. The system comprises an MRI scanner and a control unit, which is configured to control the MRI scanner to apply an excitation RF pulse to an object in order to excite spins of a first material of the object and spins of a second material of the object. The control unit is configured to control the MRI scanner to acquire a first spin echo signal when the excited spins of the first material and the excited spins of the second material include a first phase difference, which is given by $\Delta$, and to acquire a second spin echo signal when the excited spins of the first material and the excited spins of the second material include a second phase difference, which is given by $-\Delta$, wherein an absolute value of $\Delta$ lies within the interval $]0,\pi[$. The system comprises a computing unit, which is configured to generate a first image for the first material and/or a second image for the second material depending on the first spin echo signal and the second spin echo signal.

The computing unit may, for example, comprise the control unit at least partly, or vice versa, or the computing unit and the control unit may be implemented separately from each other.

The MRI scanner can be understood as a device comprising respective coils for generating RF pulses, such as the excitation RF pulse and the refocusing RF pulse, and coils for generating the main magnetic field, as well as respective field gradients in three spatial dimensions.

Further implementations of the MRI system according to the disclosure follow directly from the various implementations of the method according to the disclosure, and vice versa. For example, the MRI system according to the disclosure is configured or programmed to perform a method according to the disclosure, or the MRI system performs a method according to the disclosure.

According to the disclosure, a computer program comprising instructions is provided. When the computer program or the instructions, respectively, are executed by a MRI system according to the disclosure, the instructions cause the MRI system to carry out a method according to the disclosure.

According to the disclosure, a computer readable storage medium storing a computer program according to the disclosure is provided.

The computer program and the computer readable storage medium can be considered to represent respective computer program products.

A computing unit may e.g. be understood as a data processing device. The computing unit can therefore e.g. process data to perform computing operations. This may also include operations to perform indexed accesses to a data structure, for example a look-up table, LUT.

As an example, the computing unit may include one or more computers, one or more microcontrollers, and/or one or more integrated circuits, for example, one or more application-specific integrated circuits (ASICs), one or more field-programmable gate arrays (FPGAs), and/or one or more systems on a chip (SoC). The computing unit may also include one or more processors, for example one or more microprocessors, one or more central processing units (CPUs), one or more graphics processing units (GPU), and/or one or more signal processors, e.g. one or more digital signal processors (DSP). The computing unit may also include a physical or a virtual cluster of computers or other of said units.

In various embodiments, the computing unit includes one or more hardware and/or software interfaces and/or one or more memory units.

A memory unit may be implemented as a volatile data memory, for example a dynamic random access memory, DRAM, or a static random access memory, SRAM, or as a non-volatile data memory, for example a read-only memory, ROM, a programmable read-only memory, PROM, an erasable read-only memory, EPROM, an electrically erasable read-only memory, EEPROM, a flash memory or flash EEPROM, a ferroelectric random access memory, FRAM, a magnetoresistive random access memory, MRAM, or a phase-change random access memory, PCRAM.

If, in the context of the present disclosure, it is mentioned that a component of the magnetic resonance imaging system according to the disclosure, e.g. the control unit or the computing unit of the magnetic resonance imaging system, is adapted, configured or designed to, etc. perform or realize a certain function, to achieve a certain effect or to serve a certain purpose, this can be understood such that the component, beyond being usable or suitable for this function, effect or purpose in principle or theoretically, is physically capable of executing or realizing the function, achieving the effect, or serving the purpose by a corresponding adaptation, programming, physical design, and so on.

The features and feature combinations mentioned above or below in the description of figures and/or shown in the figures alone are usable not only in the respective specified combinations, but also in other combinations without departing from the scope of the disclosure. Implementations and feature combinations, which do not have all features of an originally formulated independent claims and/or extend beyond or deviate from the feature combinations set out in the relations of the claims, are also to be considered as disclosed.

BRIEF DESCRIPTION OF THE DRAWINGS/FIGURES

In the Figures.

DETAILED DESCRIPTION

Figure 1:
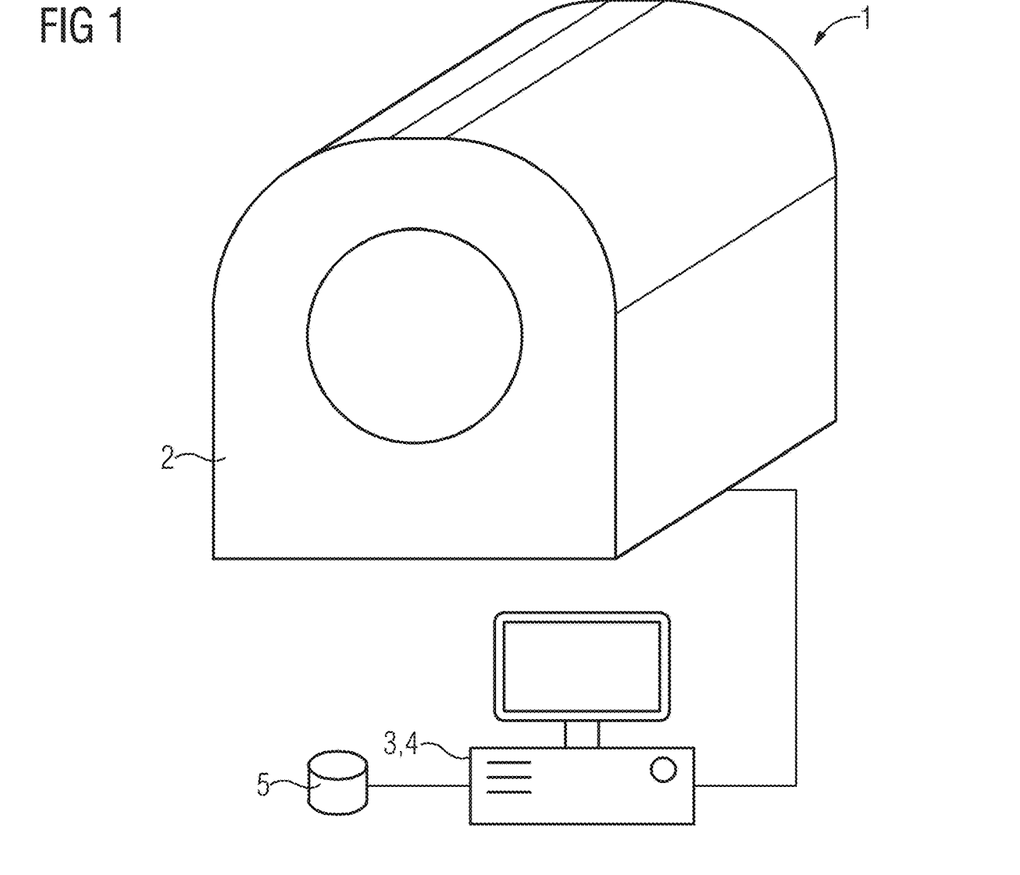
FIG. 1 illustrates schematically an exemplary implementation of an MRI system according to the disclosure.

FIG. 1 illustrates schematically an exemplary implementation of an MRI system 1 according to the disclosure.

The MRI system 1 comprises an MRI scanner 2 and a control unit 3 (e.g. a controller, control circuitry, processing circuitry, etc.) for controlling the MRI scanner 2. Furthermore, the MRI system 1 or the control unit 3 may comprise a computing unit 4 (e.g. a computer, a computing system, etc.) coupled to the control unit 3 and/or to the MRI scanner 2. The MRI system 1 may also comprise a storage unit 5. The storage unit 5 may, for example, comprise a non-transitory computer-readable medium configured to store a computer program according to the disclosure.

The MRI system 1 may be used to carry out a method according to the disclosure. For instance, the computing unit 4 may execute the computer program according to the disclosure to cause the MRI system 1 to carry out the method.

In the following, the function of the MRI system 1 is explained in more detail with respect to several implementations of methods according to the disclosure with reference to FIG. 2 to FIG. 7.

FIG. 2, FIG. 3, FIG. 5, and FIG. 7 illustrate schematic pulse diagrams for respective parts of MRI acquisition sequences. In the respective top parts above the arrow indicating time flow, applied RF pulses are shown as a function of time as triangles. In the respective bottom parts, the magnetic field gradients in read-out direction are shown as rectangles as a function of time.

Figure 2:
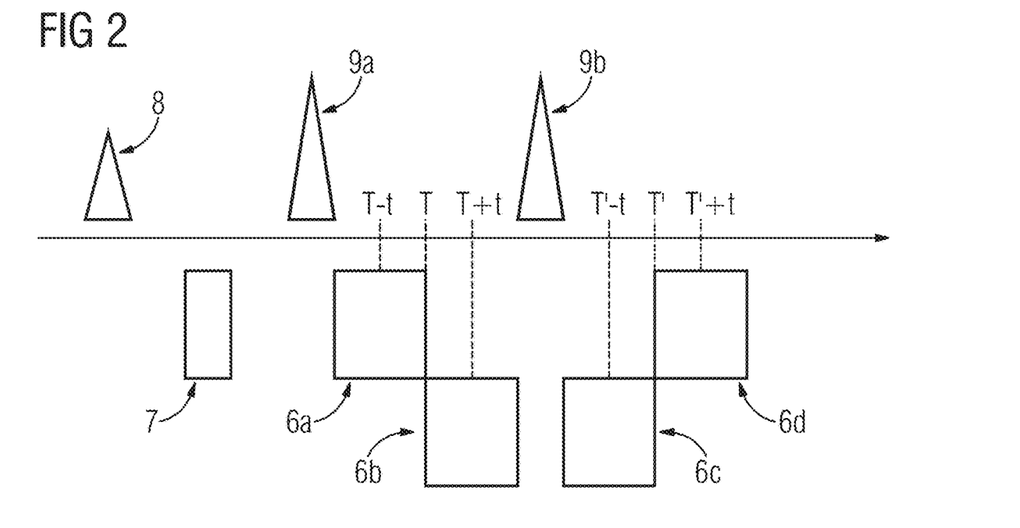
FIG. 2 illustrates a schematic pulse diagram according to an exemplary implementation of a method according to the disclosure.

As shown in FIG. 2, the control unit 3 controls the MRI scanner 2 to generate an excitation RF pulse 8 by means of a respective coil to excite nuclear spins of an object (not shown) located in the MRI scanner 2. For instance, nuclear spins of fat molecules and nuclear spins of water molecules of the object are excited by the excitation RF pulse 8.

Afterwards, the control unit 3 controls the MRI scanner 2 to apply a pre-phasing gradient lobe 7 to select the respective starting point in k-space. Then, the control unit 3 controls the MRI scanner 2 to apply a refocusing RF pulse 9a to flip the nuclear spins by 180°. The control unit 3 may control the MRI scanner 2 to apply a further refocusing RF pulse 9b, for example after a time period corresponding to a sequence time. Between the refocusing RF pulses 9a, 9b, a first read-out gradient lobe 6a, which has the same polarity as the pre-phasing gradient lobe 7, is applied by the MRI scanner 2 and after that a second read-out gradient lobe 6b, whose polarity is opposite to the polarity of the first read-out gradient lobe 6a, is applied by the MRI scanner 2

Consequently, a first spin echo signal is acquired by the MRI scanner 2 during the first read-out gradient lobe 6a and a second spin echo signal is acquired by the MRI scanner 2 during the second read-out gradient lobe 6b.

FIG. 2 shows an in-phase time T, at which the excited nuclear spins of the fat and water molecules are in-phase. The first and the second read-out gradient lobe 6a, 6b are timed such that the echo time of the first spin echo signal is (T−t) and the echo time of the second spin echo signal is (T+t), wherein t is a positive time shift. Consequently, when the first spin echo signal is acquired, the excited spins include a first phase difference Δ, which is defined by t and lies within the interval ]0,π[. Analogously, when the second spin echo signal is acquired, the excited spins include a second phase difference −Δ.

After the further refocusing RF pulse 9b, a third read-out gradient lobe 6c, which has the same polarity as the second read-out gradient lobe 6b, is applied by the MRI scanner 2 and after that a fourth read-out gradient lobe 6d, which has the same polarity as the first read-out gradient lobe 6a, is applied by the MRI scanner 2

Consequently, a third spin echo signal is acquired by the MRI scanner 2 during the third read-out gradient lobe 6c and a fourth spin echo signal is acquired by the MRI scanner 2 during the fourth read-out gradient lobe 6d.

FIG. 2 shows a further in-phase time T', at which the excited nuclear spins of the fat and water molecules are again in-phase. The third and the fourth read-out gradient lobe 6a, 6b are timed such that the echo time of the third spin echo signal is (T'−t) and the echo time of the fourth spin echo signal is (T'+t). Consequently, when the third spin echo signal is acquired, the excited spins include the first phase difference Δ and when the fourth spin echo signal is acquired, the excited spins include the second phase difference −Δ.

In other words, the first and the third spin echo signals have the same echo time and opposite read-out polarities. The same holds for the second and the fourth spin echo signals. The resulting phase differences may be addressed when separating the fat and water contributions.

Figure 3:
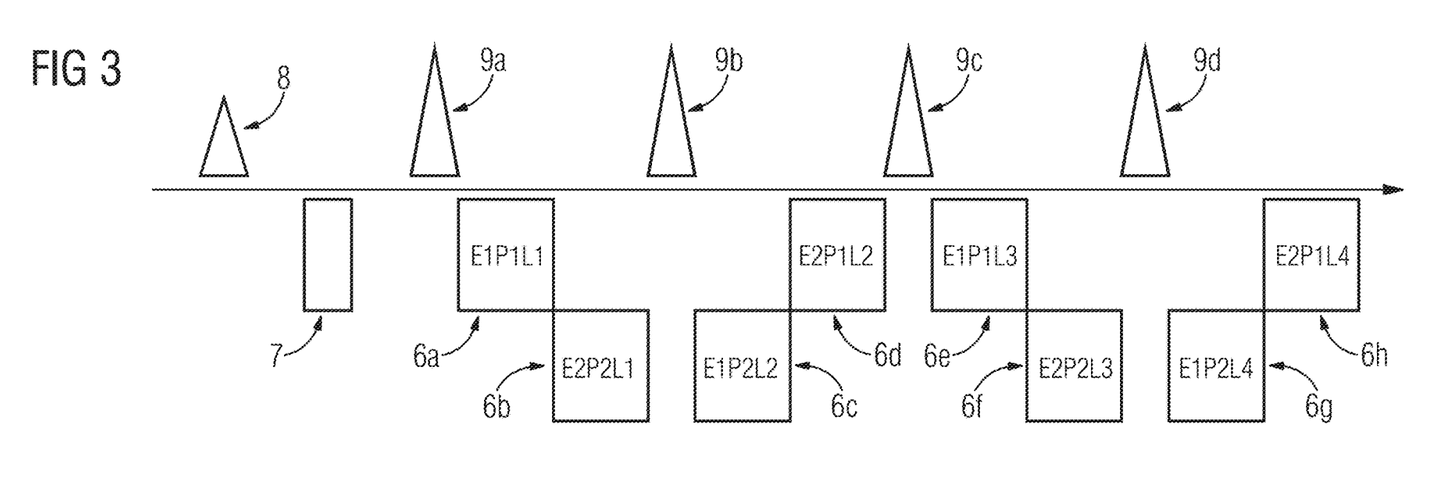
FIG. 3 illustrates a schematic pulse diagram according to a further exemplary implementation of a method according to the disclosure.

FIG. 3 shows the same sequence as FIG. 3 and additionally two further refocusing RF pulses 9c, 9d and corresponding read-out gradient lobes 6e, 6f, 6g, 6h.

Furthermore, the spin echo signals corresponding to the different read-out gradient lobes 6a, 6b, 6c, 6d, 6e, 6f, 6g, 6h are labelled according to their echo IDs E1 or E2, the respective read-out polarities P1 or P2 and the line IDs or segment IDs L1, L2, L3 or L4, each corresponding to one of the refocusing RF pulses 9a, 9b, 9c, 9c.

Consequently, the first spin echo signal is denoted by E1P1L1, the second spin echo signal is denoted by E2P2L1, the third spin echo signal is denoted by E1P2L2, the fourth spin echo signal is denoted by E2P1L2, and so forth.

For generating the first image 10a and the second image 10b, all spin echo signals with the echo ID E1, namely E1P1L1, E1P2L2, E1P1L3 and E1P2L4, may be considered within a common k-space. Analogously, all spin echo signals with the echo ID E2, namely E2P2L1, E2P1L2, E2P2L3 and E2P1L4, may be considered within a common k-space. This is depicted schematically in FIG. 4.

Figure 4:
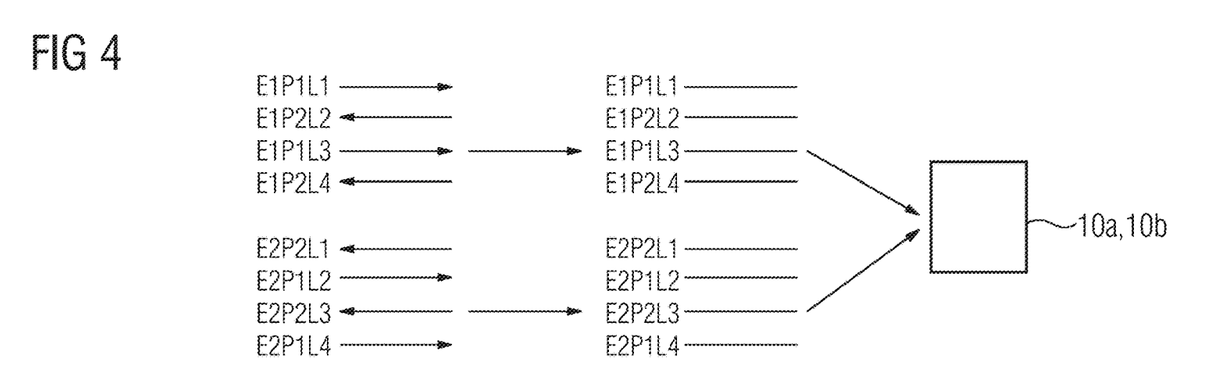
FIG. 4 illustrates schematically aspects of image reconstruction according to a further exemplary implementation of a method according to the disclosure.

The respective spin echo signals of a common k-space may be phase corrected, for example in a TGSE-like manner, and then combined to obtain the first image 10a and the second image 10b. A reference scan without phase encoding may be performed upfront.

Figure 5:
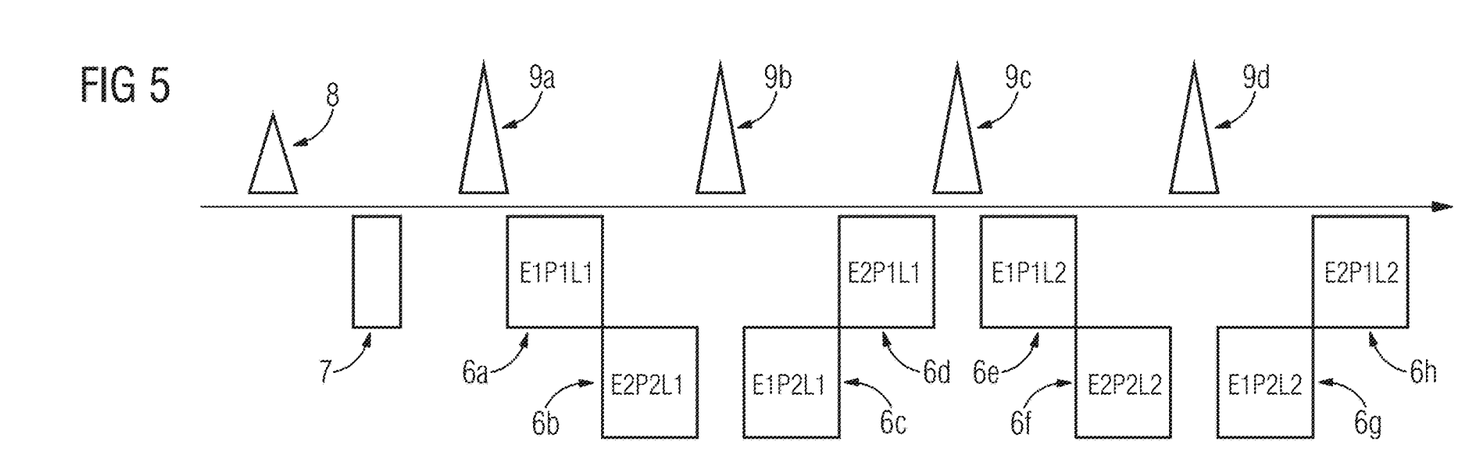
FIG. 5 illustrates a schematic pulse diagram according to a further exemplary implementation of a method according to the disclosure.

In other implementations, only spin echo signals with the same echo time and the same readout polarity may be considered in a common k-space. In other words, one k-space is sampled for each readout polarity. This is visualized in FIG. 5 and FIG. 6. The diagram of FIG. 5 is based on the diagram of FIG. 3, wherein the line IDs are distributed such that two subsequent refocusing RF pulses share a common line ID. The resulting spin echo signals are denoted by E1P1L1, E2P2L1, E1P2L1, E2P1L1 for the first and the second refocusing RF pulse 9a, 9b and by E1P1L2, E2P2L2, E1P2L2, E2P1L2 for the third and the fourth refocusing RF pulse 9c, 9d.

Figure 6:
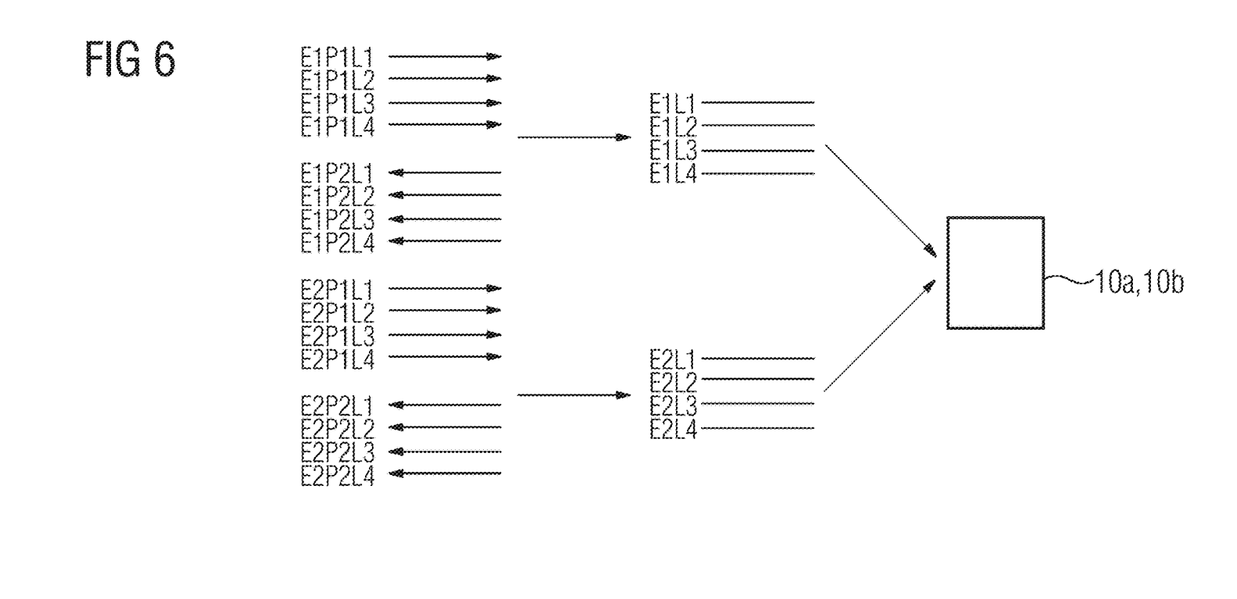
FIG. 6 illustrates schematically aspects of image reconstruction according to a further exemplary implementation of a method according to the disclosure.

Four more refocusing RF pulses (not shown) corresponding to the line IDs L3 and L4 yield eight further spin echo signals E1P1L3, E2P2L3, E1P2L3, E2P1L3, E1P1L4, E2P2L4, E1P2L4 and E2P1L4.

For instance, each line ID is considered in a separate k-space. After a 2D phase correction of these four k-spaces, complex averaging may be applied to obtain two k-space. The corresponding combined signals E1L1, E1L2, E1L3, E1L4, E2L1, E2L2, E2L3, and E2L4 are independent of the polarities. Afterwards, the separation of contributions from the different materials may be performed to obtain the first and the second image 10a, 10b.

Figure 7:
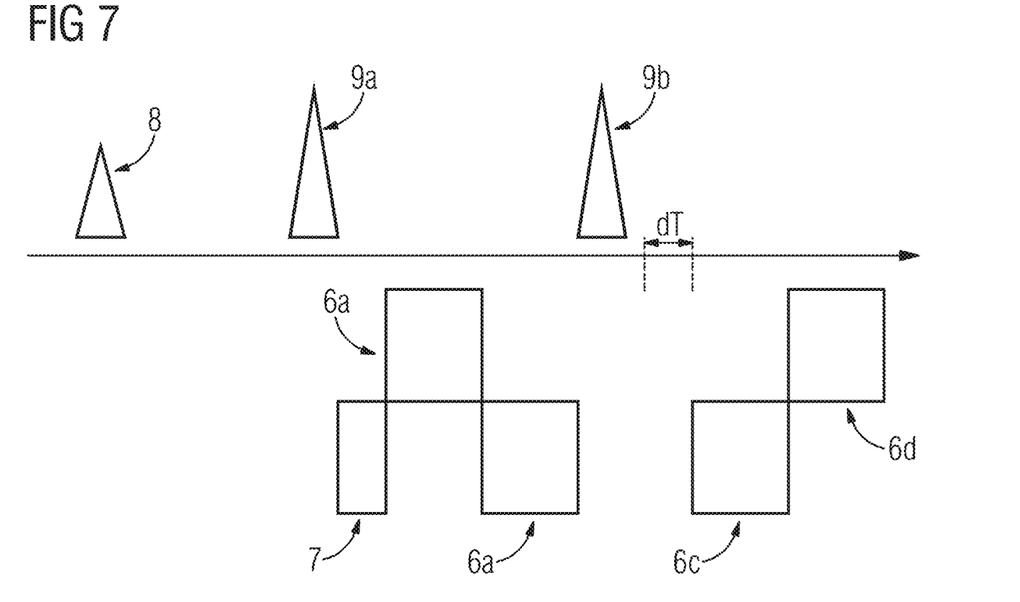
FIG. 7 illustrates a schematic pulse diagram according to a further exemplary implementation of a method according to the disclosure.

A pulse diagram according to a further implementation of a method according to the disclosure is shown in FIG. 7. The pulse diagram is based on the pulse diagram of FIG. 2.

In FIG. 7, however, instead of applying the pre-phasing gradient lobe 7 before the first refocusing RF pulse 9a, it is shifted to the beginning of the first echo segment. In other words, the pre-phasing gradient lobe 7 is applied between the first refocusing RF pulse 9a and the first read-out gradient lobe 6a. This reduces the time between the pre-phasing gradient lobe 7 and the acquisition and may therefore reduce flow artifacts. Due to the 180°-flip by the first refocusing RF pulse 9a, the polarity of the pre-phasing gradient lobe 7 is opposite compared to FIG. 2. In order to ensure consistent echo times, a time delay dT is present between the second refocusing RF pulse 9b and the third read-out gradient lobe 6c. The duration of the time delay dT is equal to the duration of the pre-phasing gradient lobe 7.

As explained, in particular with respect to the Figures, the disclosure allows for a Dixon like acquisition with a reduced acquisition time and/or with reduced artifacts.

The various components described herein may be referred to as "devices" or "units." As noted above, such components may be implemented via any suitable combination of hardware and/or software components as applicable and/or known to achieve the intended respective functionality. This may include mechanical and/or electrical components, processors, processing circuitry, or other suitable hardware components configured to execute instructions or computer programs that are stored on a suitable computer readable medium. Regardless of the particular implementation, such devices and units, as applicable and relevant, may alternatively be referred to herein as "circuitry," "processors," or "processing circuitry."

What is claimed is:

1. A method for magnetic resonance imaging of an object, comprising:
    exciting spins of a first material of the object;
    exciting spins of a second material of the object;
    acquiring a first spin echo signal when the excited spins of the first material of the object and the excited spins of the second material of the object include a first phase difference, which is represented as Δ;
    acquiring a second spin echo signal; and
    generating, via processing circuitry, a first image for the first material of the object and/or a second image for the second material of the object, based upon the first spin echo signal and the second spin echo signal,
    wherein an absolute value of Δ lies within an interval ]0,π[, and
    wherein the second spin echo signal is acquired when the excited spins of the first material of the object and the excited spins of the second material of the object include a second phase difference, which is represented as −Δ.

2. The method according to claim 1, further comprising:
applying a first read-out gradient lobe, which is centered at a first read-out center time, to acquire the first spin echo signal; and
applying a second read-out gradient lobe, which is centered at a second read-out center time, to acquire the second spin echo signal,
wherein the first read-out center time precedes an in-phase time,
wherein the excited spins of the first material of the object and the excited spins of the second material of the object are in phase at the in-phase time, and
wherein the second read-out center time succeeds the in-phase time.

3. The method according to claim 2, wherein the first read-out gradient lobe and the second read-out gradient lobe have opposite polarities.

4. The method according to claim 1, further comprising:
applying a refocusing radio frequency (RF) pulse before acquiring the first spin echo signal and the second spin echo signal.

5. The method according to claim 4, further comprising:
applying a pre-phasing gradient lobe prior to applying the refocusing RF pulse.

6. The method according to claim 4, further comprising:
applying a pre-phasing gradient lobe after applying the refocusing RF pulse and before acquiring the first spin echo signal and second spin echo signal.

7. The method according to claim 1, further comprising:
acquiring a third spin echo signal when the excited spins of the first material of the object and the excited spins of the second material of the object include the second phase difference;
acquiring a fourth spin echo signal when the excited spins of the first material of the object and the excited spins of the second material of the object include the first phase difference; and
generating the first image and/or the second image further based upon the third spin echo signal and the fourth spin echo signal.

8. The method according to claim 7, further comprising:
applying a third read-out gradient lobe, which is centered at a third read-out center time, to acquire the third spin echo signal; and
applying a fourth read-out gradient lobe, which is centered at a fourth read-out center time, to acquire the fourth spin echo signal,
wherein the third read-out center time precedes a further in-phase time,
wherein the excited spins of the first material of the object and the excited spins of the second material of the object are in phase at the further in-phase time, and
wherein the fourth read-out center time succeeds the further in-phase time.

9. The method according to claim 8, further comprising:
applying a first read-out gradient lobe, which is centered at a first read-out center time, to acquire the first spin echo signal; and
applying a second read-out gradient lobe, which is centered at a second read-out center time, to acquire the second spin echo signal, and wherein:
the first read-out center time precedes an in-phase time,
the excited spins of the first material of the object and the excited spins of the second material of the object are in phase at the in-phase time,
the second read-out center time succeeds the in-phase time,
the first read-out gradient lobe and the third read-out gradient lobe have opposite polarities, and
the second read-out gradient lobe and the fourth read-out gradient lobe have opposite polarities.

10. The method according to claim 7, further comprising:
applying a further refocusing radio frequency (RF) pulse after acquiring the first spin echo signal and the second spin echo signal and before acquiring the third spin echo signal and the fourth spin echo signal.

11. The method according to claim 10, further comprising:
applying a pre-phasing gradient lobe after applying the refocusing RF pulse and before acquiring the first spin echo signal and the second spin echo signal,
wherein a time delay corresponding to a duration of the pre-phasing gradient lobe is present between applying the further refocusing RF pulse and before acquiring the third spin echo signal.

12. The method according to claim 1, wherein an absolute value of $\Delta$ lies within an interval $[\pi/6, 5\pi/6]$ or within an interval $[\pi/4, 3\pi/4]$.

13. The method according to claim 1, wherein the method is based on a spin echo acquisition technique or a turbo spin echo acquisition technique.

14. A magnetic resonance imaging system, comprising:
a magnetic resonance imaging scanner; and
processing circuitry configured to control the magnetic resonance imaging scanner to cause the magnetic resonance imaging scanner to:
apply an excitation radio frequency (RF) pulse to excite spins of a first material of an object and spins of a second material of the object;
acquire a first spin echo signal when the excited spins of the first material of the object and the excited spins of the second material of the object include a first phase difference, which is represented as $\Delta$;
acquire a second spin echo signal; and
generate a first image for the first material of the object and/or a second image for the second material of the object based upon the first spin echo signal and the second spin echo signal,
wherein an absolute value of $\Delta$ lies within the interval $]0,\pi[$, and
wherein the second spin echo signal is acquired when the excited spins of the first material of the object and the excited spins of the second material of the object include a second phase difference, which is represented as $-\Delta$.

15. A non-transitory computer-readable medium identified with a magnetic resonance imaging system having instructions stored thereon that, when executed by one or more processors of the magnetic resonance imaging system, cause the magnetic resonance imaging system to:
apply an excitation radio frequency (RF) pulse to excite spins of a first material of an object and spins of a second material of the object;
acquire a first spin echo signal when the excited spins of the first material of the object and the excited spins of the second material of the object include a first phase difference, which is represented as $\Delta$;
acquire a second spin echo signal; and
generate a first image for the first material of the object and/or a second image for the second material of the object based upon the first spin echo signal and the second spin echo signal,
wherein an absolute value of $\Delta$ lies within the interval $]0,\pi[$, and wherein the second spin echo signal is acquired when the excited spins of the first material of the object and the excited spins of the second material of the object include a second phase difference, which is represented as $-\Delta$.

\* \* \* \* \*